United States Patent
Bedjaoui et al.

(10) Patent No.: US 10,446,810 B2
(45) Date of Patent: Oct. 15, 2019

(54) CASE FOR MICROELECTRONIC COMPONENTS

(71) Applicant: COMMISSARIAT A L'ENERGIE ATOMIQUE ET AUX ENERGIES ALTERNATIVES, Paris (FR)

(72) Inventors: Messaoud Bedjaoui, Voreppe (FR); Raphael Salot, Lans-en-Vercors (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 439 days.

(21) Appl. No.: 15/291,571

(22) Filed: Oct. 12, 2016

(65) Prior Publication Data

US 2017/0104195 A1   Apr. 13, 2017

(30) Foreign Application Priority Data

Oct. 13, 2015   (FR) .................................... 15 59716

(51) Int. Cl.
*H01M 2/10* (2006.01)
*H01M 4/525* (2010.01)
(Continued)

(52) U.S. Cl.
CPC ......... *H01M 2/1022* (2013.01); *H01M 4/525* (2013.01); *H01M 4/5815* (2013.01);
(Continued)

(58) Field of Classification Search
CPC ... H01M 2/1022; H01M 4/525; H01M 4/5815
See application file for complete search history.

(56) References Cited

U.S. PATENT DOCUMENTS 6,238,951 B1    5/2001  Caillat
6,474,123 B1 * 11/2002  Kito ...................... E05B 19/046
                                                       206/37.2
(Continued)

FOREIGN PATENT DOCUMENTS

EP    1 557 394 b1    3/2010
EP    2 421 037 A1    2/2012
(Continued)

OTHER PUBLICATIONS

Freath Preliminary Search Report dated Jul. 18, 2016 (with Written Opinion) in French Application 15 59716 filed on Oct. 13, 2015 (with English Translation of Categories of Cited Documents).
(Continued)

*Primary Examiner* — Olatunji A Godo
(74) *Attorney, Agent, or Firm* — Oblon, McClelland, Maier & Neustadt, L.L.P.

(57) ABSTRACT

The invention relates to an electronic system comprising at least one device comprising a substrate (110) carrying at least one electronic component provided with at least one electrical connector (121, 122), with the system further comprising a support of said device, characterised in that the device comprises at least one passage (361, 362) according to a dimension in thickness of the device, said passage passing through the electrical connector (121, 122), and in that it comprises at least one electrically conductive pillar (471, 472) protruding on a first face of the support, with the electrically conductive pillar (471, 472) passing through the passage (361, 362) by being configured to be in electrical continuity with the electrical connector (121, 122) passed through by said passage.

23 Claims, 5 Drawing Sheets

(51) Int. Cl.
  *H01M 4/58* (2010.01)
  *H01M 10/0525* (2010.01)
  *H01M 10/0562* (2010.01)
  *H05K 5/02* (2006.01)
  *H01M 10/04* (2006.01)
(52) U.S. Cl.
  CPC ... *H01M 10/0436* (2013.01); *H01M 10/0525* (2013.01); *H01M 10/0562* (2013.01); *H05K 5/0247* (2013.01); *H01M 2220/30* (2013.01)

(56) References Cited

U.S. PATENT DOCUMENTS

| | | |
|---|---|---|
| 9,387,336 B2 | 7/2016 | Perraud et al. |
| 2003/0107119 A1 | 6/2003 | Kim |
| 2003/0232460 A1 | 12/2003 | Poo et al. |
| 2004/0124523 A1 | 7/2004 | Poo et al. |
| 2005/0205968 A1 | 9/2005 | Kim |
| 2006/0208350 A1 | 9/2006 | Poo et al. |
| 2006/0208351 A1 | 9/2006 | Poo et al. |
| 2008/0094793 A1 | 4/2008 | Sakurai et al. |
| 2012/0107669 A1 | 5/2012 | Viavattine |
| 2015/0084157 A1 | 3/2015 | Tegen et al. |
| 2015/0273219 A1 | 10/2015 | Perraud et al. |

FOREIGN PATENT DOCUMENTS

| | | |
|---|---|---|
| EP | 2 926 865 A1 | 10/2015 |
| JP | 2001-127241 | 5/2001 |
| JP | 2009-105326 | 5/2009 |
| WO | WO 94/28581 | 12/1994 |
| WO | WO 2012/057853 A1 | 5/2012 |

OTHER PUBLICATIONS

European Search Report dated Mar. 14, 2017 in Patent Application No. 16193588.7 (with English Translation of Category of Cited Documents).

* cited by examiner

CASE FOR MICROELECTRONIC COMPONENTS

TECHNICAL FIELD OF THE INVENTION

The invention relates to an electrical system and a method for the manufacture thereof. The invention applies in particular to the packaging of microelectronic devices sensitive to air and the three-dimensional (3D) assembly thereof allowing for the obtaining of sealed modules or cases with a high integration density.

The invention has a particular application in the assembly of individual micro-batteries with the purpose of carrying out supply solutions with a high density of energy.

PRIOR ART

The assembly of chips and various electronic devices produced by the microelectronics industry is all the more difficult in that the active layers of the electronic components assembled are sensitive to the air and to their environment in general. It is the role of the case to allow, on the one hand, an assembly of the individual chips that it has to contain with the desired integration density and the interconnection thereof while still guaranteeing, on the other hand, a sustainable operation of the device produced by a good seal with respect to oxidising species that over time can alter the operation of the chips. Concretely, the levels of sealing required are expressed in VVVTR and OTR, acronyms for "water vapour transmission rate" and "oxygen transmission rate" respectively. According to the degree of sensitivity of the active layers of the electronic components assembled, the permissible values for these parameters can vary between $10^{-3}$ and $10^{-6}$ cm$^3 \cdot$m$^{-2} \cdot$j$^{-1}$.

Moreover, the carrying out of internal interconnections, between chips on the one hand, and with the external pins of the case on the other hand, make use of many techniques such as, among others, brazing, thermocompression and the use of epoxy adhesives whether or not loaded with silver. A disadvantage of these techniques is that use must be made in order to implement them during the assembly of chips with annealing steps that are carried out at temperatures that are often high typically with a range from 250° C. up to 1100° C. which imposes severe constraints during the assembly phase.

For example, the international patent application published under number WO94/28581 describes a typical method for assembling components of prior art wherein a cavity in a controlled atmosphere is created and wherein is effectively obtained a case that guarantees a good quality seal with regards to the levels required for all of the applications sensitive to the air. However, the carrying out of the interconnections described in this example requires calling upon technological steps that implement high temperatures and in particular the brazing of fusible materials already mentioned hereinabove. The melting temperature of these materials can then be substantially higher than the maximum operating temperature of many recent components for which it would be desirable to be able to assemble without damage. Among these components are those that allow for the storage of energy such as lithium micro-batteries or all components from organic electronics in particular OLEDs (acronym for "organic light-emitting diodes"), OPVs (acronym for "organic photo voltaic cells"); OPDs (acronym for "organic photo detectors") as well as TFTs (acronym for "thin film transistor"). By way of example, the maximum operating temperature of a solid lithium metal battery is set by the melting temperature of this material which is only 180° C. The organic devices are even more constraining which withstand temperatures that cannot withstand values of about 100° C.

This invention makes it possible to overcome at least partially the disadvantages of current techniques. A potential object of the invention is to produce a sealed case enclosing at least one electronic component in an improved manner, in particular in terms of an electrical connection through the case.

SUMMARY OF THE INVENTION

An aspect of the invention relates to an electronic system comprising at least one device comprising a substrate carrying at least one electronic component provided with at least one electrical connector, with the system further comprising a support of said device.

Advantageously, this system is such that the device comprises at least one passage according to a dimension in thickness of the device, said at least one passage passing through at least the electrical connector, and it comprises at least one electrically conductive pillar protruding on a first face of the support, with the electrically conductive pillar passing through the passage by being configured to be in electrical continuity with the electrical connector passed through by said passage.

Another aspect of the invention relates to a method for manufacturing an electrical system comprising at least one device comprising a substrate carrying at least one electronic component provided with at least one electrical connector, with the system further comprising a support of said device, characterised in that it comprises:

the forming in the device of at least one passage according to a dimension in thickness of the device, said passage passing through at least the electrical connector;

the forming of at least one electrically conductive pillar protruding on a first face of the support;

the mounting of the device on the support in such a way that each electrically conductive pillar passes through the passage by being configured to be in electrical continuity with the electrical connector passed through by said passage.

As such, the pillar produces the electrical connection of the component carried by the device according to the height of the system; this connection comprises a mechanical mounting phase of the device, as insertion, around the pillar or pillars in such a way that the connection is facilitated and can be produced at a low temperature.

BRIEF DESCRIPTION OF THE FIGURES

The purposes, objects, and characteristics and advantages of the invention shall appear better in the detailed description of an embodiment of the latter which is shown by the following accompanying drawings wherein.

Figure 1:
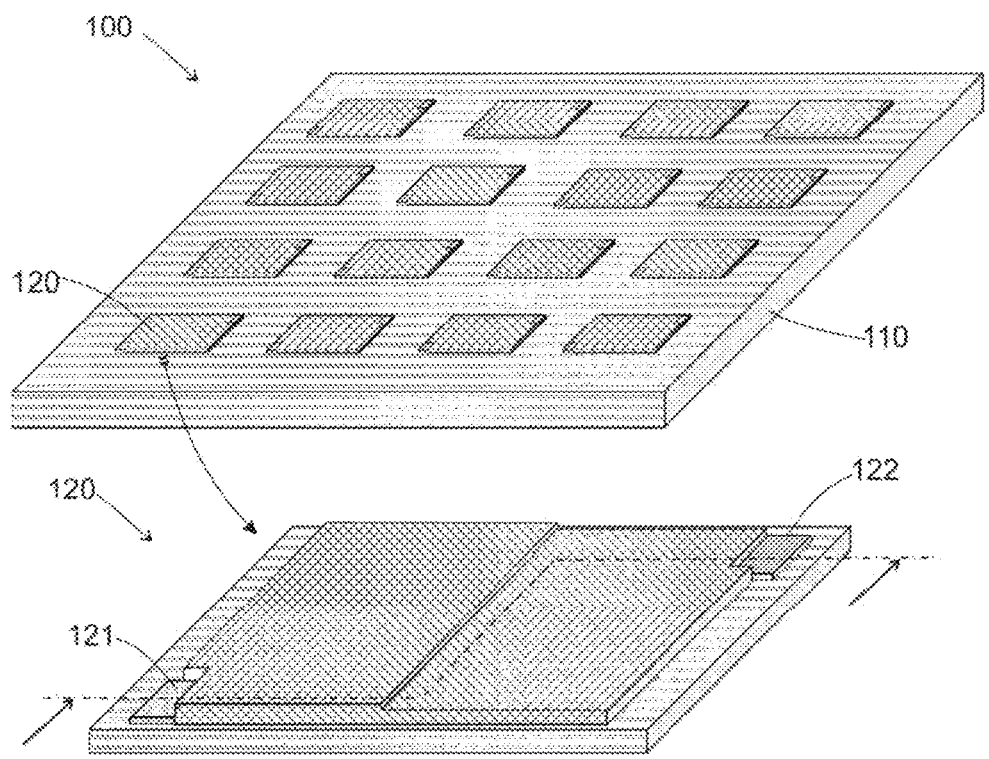
FIG. 1 shows the obtaining of the elements to be assembled in a case according to the invention i.e. micro-batteries according to an embodiment of the latter.

The drawings are given by way of examples and do not limit the invention. They constitute diagrammatical block representations intended to facilitate the understanding of the invention and are not necessarily to scale of the practical applications. In particular, the relative thicknesses of the various layers and substrates may not be representative of reality.

DETAILED DESCRIPTION OF THE INVENTION

Before beginning a detailed review of the embodiments of the invention, are announced hereinafter optional characteristics that can possibly be used according to any association or alternatively:

- the electrically conductive pillar passes through the support in such a way as to be exposed on a second face of the support opposite the first face. As such, the pillar authorises the electrical access by the outside of the system.
- the electronic component comprises two electrical connectors each one passed through by a passage, with the system comprising two electrically conductive pillars each one in electrical continuity with one, different, of the two electrical connectors through the passage of said one of two connectors.
- the device is of rectangular section according to a plane perpendicular to the dimension in thickness and the two electrically conductive pillars are directed according to a diagonal of said section. The rectangular section extends as including a square section. Other forms are possible of which a circular polygonal, oval shape.
- the system comprises several devices as superposition according to the dimension in thickness, each one with a passage passed through by the at least one electrically conductive pillar.
- the at least one electrically conductive pillar comprises a contact interface configured for assuring an electrical continuity between a trunk portion of the pillar and the electrical connector.
- the contact interface is a resin or an electrically conductive metal layer, that more preferably covers the entire trunk of the pillar; the metal layer can be deposited by a conventional technique with or without a mask.
- the system comprises a case defining a cavity for receiving the at least one device, with the support forming a bottom of the case, with the case comprising a lateral wall extending from the support according to the dimension in thickness. A cavity as such receives the devices, in such a way as to package them.
- the lateral wall and the support are single-block. In this sense, they can be formed from a single piece of the same material. They can however also be made of initially separate and attached parts;
- a cover closes the cavity and bears against the lateral wall.
- the cover comprises, for each electrically conductive pillar, a passage according to a dimension in thickness of the cover in such a way as to expose the pillar on a face of the cover oriented outside of the case.
- the cover carries at least one electronic component provided with at least one electrical connector passed through by a passage of the cover, with one of the at least one electrically conductive pillar passing through the passage by being configured to be in electrical continuity with the electrical connector passed through by said passage.
- at least one electronic component carried by the cover is located on a face of the cover oriented towards the inside of the cavity and is preferably connected to the pillar.
- the cavity comprises an electrically insulating filling material around the at least one device.
- the electrically conductive pillar is electrically insulated from the support.
- the at least one electrical component is a battery.
- at least one additional pillar is protruding on the first face of the support, with each additional pillar passing through a passage formed in the device according to the dimension in thickness, with the additional pillar being configured to not be in electrical continuity with an electrical connector of the electronic component.
- the forming of at least one electrically conductive pillar is configured in such a way that it passes through the support in order to be exposed on a second face of the support opposite the first face.
- the method comprises the forming of a case defining a cavity for receiving the at least one device, with the support forming a bottom of the case, with the case comprising a lateral wall extending from the support according to the dimension in thickness.
- the lateral wall and the bottom are obtained by formation of the cavity in a starting substrate.
- the method comprising the forming of at least one electrically conductive pillar comprises the forming of a hollow pattern of a pillar trunk in the starting substrate and the filling of the pattern by an electrically conductive material.
- the method for forming the case comprises, after the forming of the at least one electrically conductive pillar, an etching of a portion of the starting substrate configured to leave in place the at least one pillar, the bottom and the lateral wall of the case.
- the formation of at least one electrically conductive pillar comprises the forming of a pillar trunk portion protruding on the support and wherein the forming of at least one passage and the forming of at least one electrically conductive pillar are configured to preserve a space between the pillar trunk and the passage, with the method comprising a step of forming a contact interface between the pillar trunk and the passage, by filling at least the space with a conductive resin.

It is specified that, in the framework of this invention, the term "on" or "above" does not necessarily mean "in contact with". As such, for example, the deposition of a layer on another layer, does not necessarily mean that the two layers are directly in contact with one another but this means that one of the layers covers at least partially the other by being either directly in contact with it, or by being separated from it by a film, or another layer or another element. The cover placed on the support therefore does not necessarily imply a contact between these two elements; on the contrary, a space is preferentially preserved, by forming a cavity.

Figure 2:
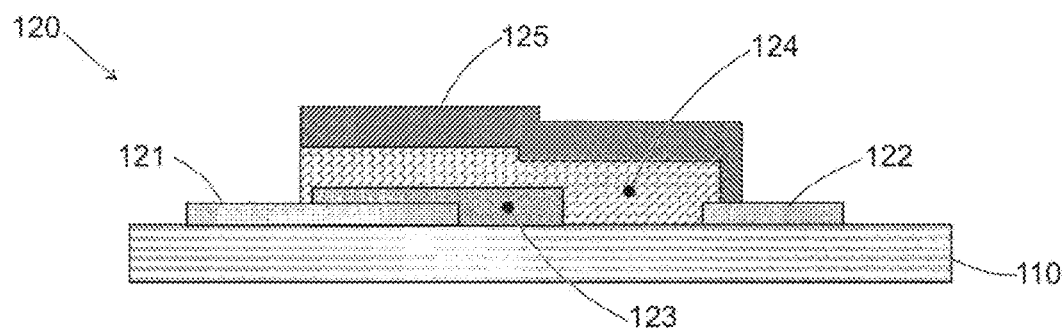
FIG. 2 is a cross-section view of a micro-battery to be assembled according to the dotted line of FIG. 1.

It is specified that in the framework of this invention, the thickness of a layer is measured according to a direction perpendicular to the surface according to which this layer has its maximum extension. In FIG. 2 for example, the thickness is taken according to the vertical.

The invention in particular relates to a method of carrying out an electrical system, more preferably a microelectronic device. According to the invention, the term microelectronic device means a device comprising elements of micronic and/or nanometric dimensions. The same applies to the term "electronic component". Any system that has for its operation at least one electrical element falls within the scope of this invention. The system of the invention can encompass components of different natures.

The method that follows has for preferred purpose to carry out a (micro)electronic device in reference to the figures. It is meant preferably by substrate, a chip or a plate (more commonly referred to as a "wafer") that comprises at least one chip.

The field of application of this invention potentially covers the entire range of devices produced by the microelectronics industry and is of more particular interest for those of devices which are confronted with the constraints linked to the sensitivity of their active layers to the oxidising elements contained in their environment in particular steam and the oxygen of the ambient air. The field of application extends to any sophisticated electronic system that performs complex functionality generally obtained by associating several individual electronic components. Without loss of generality, the invention is more particularly described hereinafter using an example wherein an assembly is carried out in a case of solid micro-batteries made of lithium metal carried out beforehand in thin layers (TFT) on ultrathin substrates with a thickness of less than 100 µm (µm or micrometer=$10^{-6}$ meter).

The steps of this specific example of an assembly according to the invention of lithium micro-batteries are summarised in detail hereinafter.

It is in particular an object of the invention to describe a method that does not necessarily require the implementing of operations that take place at high temperatures, in order to not damage the assembled components. It is also a potential object of the invention to describe a method that makes it possible to obtain a case or module that is sufficiently sealed which provides a sustainable operation of the assembled device by preserving the chips that it is comprised of from degradation due to the oxidising gases of the atmosphere i.e. steam and oxygen.

In a preferred embodiment corresponding to the figures, the system of the invention comprises a plurality of devices with each one carrying at least one electronic component. It is understood that the invention can comprise only one of these devices.

FIG. 1 shows the result of a first step during which the electronic components carried by the devices to be assembled, i.e. here sets of micro-batteries in this embodiment of the invention, are produced. According to an embodiment, a set 100 of individual batteries 120 is arranged simultaneously on a substrate 110 forming a host substrate, for example made of glass, during the same series of manufacturing steps. Typically, the glass used belongs to the family of borosilicates. A glass from this commonly used family is known under the reference "AF32". The thickness of the host substrate which constitutes the basis of the device is typically 50 µm. It can receive a set of several micro-batteries arranged for example, as shown in FIG. 1, in a matrix manner or only a single micro-battery.

FIG. 2 is a diagrammatical cross-section view of an individual battery 120. It shows the stack of layers comprising an individual battery and in particular its connectors 121 and 122 which are here current collectors, with the whole resting on the substrate 110. The association of the substrate 110 and of at least one electronic component such as a battery 120 forms a device of the invention, that can be added onto a case support described hereinbelow.

One of the connectors is referred to as cathodic and the other as anodic. It is the connectors 121 and 122 that play these roles. They are both conductors and more preferably of a metal nature and made for example from titanium, gold, aluminium, platinum, tungsten and plus generally comprised of any other metal or metal alloy that has good electrical conductivity. With a typical thickness of 0.5 µm the connectors are arranged directly on the substrate 110. Each connector 121, 122 assure a possibility of renewed contact pour an electrode 123, 125. These electrodes 123, 125 surround an electrically insulating separator layer formant an electrolyte 124.

The active layers of the micro-battery that can be sensitive to the ambient air and to the environment are substantially the two electrodes 123 and 125 and the electrolyte 124. The positive electrode 123, of a typical thickness of 5 µm, is advantageously made from a material that has good electronic and ionic conductivity such as for example the following materials: $TiOS$, $TiS_2$, $LiTiOS$, $LiTiS_2$, $LiCoO_2$ and $V_2O_5$. The electrolyte 124, of a typical thickness of 2 µm, is an electronic insulator with a high ionic conductivity. LiPON is the most commonly used electrolyte in micro-battery technology but other materials are also used such as LiPONB and LiSiCON. The negative electrode 125 is a layer with a typical thickness of 2 µm which can be constituted exclusively of lithium metal, a battery referred to as "lithium metal" is then obtained. The negative electrode can also be made from a metal referred to as "lithiated", i.e. incorporating lithium, a battery referred to as "lithium ion" is then obtained. Batteries made of lithium metal are extremely sensitive to oxidising areas. They require a level of sealing of the case that is higher than that of the so-called "lithium ion".

The electronic component can for example have an outside contour with straight edges. More preferably, the stack of layers comprises, on each connector 121, 122, a detaching, for example a recessed corner forming an angle of 90°, in such a way as to define a zone of the component where only the connector 121, 122 is exposed. This exposed zone of each connector 121, 122 can have any shape and any location adapted to the desired application. Preferably, this zone is at the periphery of the rest of the electronic component. In a case not shown, at least one of the connectors does not rest, or not entirely, on the substrate 110; it can for example be offset laterally in relation to an edge of the substrate 110 or encore by in elevation with respect to the face of the substrate 110. As such, the portion of the connector that cooperates with the pillar (which shall be described in detail further on) is not necessarily in contact with the substrate 110. In this case, it is not necessary for the passage (which shall be described in detail further on) to also pass through the substrate.

In the following step passages for the through-vias are carried out and, if they were carried by the same host substrate, a separation is made of the micro-batteries in order to allow for the 3D assembly thereof in a case of the invention. According to a preferred embodiment of the invention shown in FIG. 3, passages for through-vias are carried out on each one of the individual batteries after having formed the latter as described in FIG. 2 and obtained the corresponding stack layers. The passages 361 and 362, are positioned inside the more preferably flat surface defined by the exposed zones of the two current connectors 121 and 122. Two passages are as such created, for example of a circular shape with a diameter of 500 μm, that completely pass through the superimposed layers constituted by the current connectors 121 and 122 and the substrate made of glass 110. The passages of through-vias are obtained after having carried out conventional laser ablation operations known to those skilled in the art and practiced in a conventional manner using, for example, an excimer laser using a source with a wavelength of 248 nm or a so-called YAG laser, acronym referring to the use as an amplifier of doped yttrium aluminium garnet, with a wavelength of 355 nm. The section of the passages can be chosen of any shape. Simple geometrical shapes: square, rectangle, circle or oval, are more preferably retained. In a first case, the shape chosen corresponds to the section of the pillar trunks of a case according to the invention as described hereinafter. This allows for a direct contact between the wall of the passage (and especially with the perimeter of the corresponding connector) and the pillar. In another case, a play can subsist in the form of a space between passage and pillar trunk, and a conductive interface is used, more preferably in the form of a conductive resin, as described hereinbelow.

Optionally, the passages 361 and 362, of the same individual battery can be of different shapes. Optionally, the openings of the passages of through-vias can be carried out after deposition and formation of current collecting zones carried out by the connectors 121 and 122, and before the creation of the active layers of the micro-battery 123, 124 and 125.

After creation of the passages 361, 362 on the micro-battery 120 of a set 100 of micro-batteries starting from the same host substrate, they are separated by cutting the host substrate 110 by having recourse, for example, to mechanical sawing, a technique which is commonly practised by the entire microelectronics industry for separating chips. In the case of a substrate made of thin glass such as in the invention, another laser cutting technique can also be used which is also in current practice. Different types of laser can be used for this purpose: carbon dioxide (CO2) laser, YAG or excimer laser mentioned hereinabove and femtosecond laser.

Figure 3:
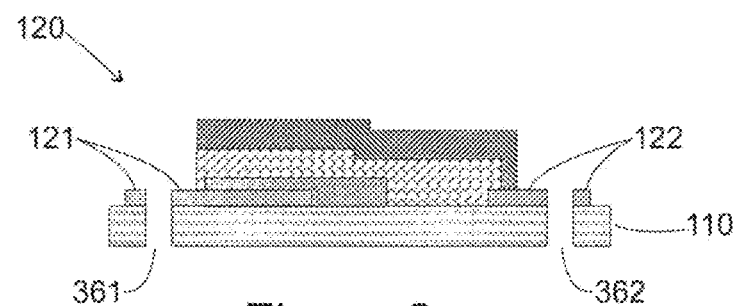
FIG. 3 shows the carrying out of passages of through-vias in a micro-battery intended to be assembled in a case according to the invention.

FIG. 3 therefore shows the stack of layers formed on the substrate 110 and constituting a battery 120 characterised, with regards to the invention, by its current connectors, 121 and 122, and its passages of through-vias, 361 and 362. In this example, the total surface occupied by an individual battery after cutting is typically a square with a side of 1 centimeter with a total thickness which is about 9.5 μm. The surfaces occupied by the exposed current collecting zones, 121 and 122, are identical and each occupy a square with a side of about 1 millimeter. These values are given by way of example and do not limit the invention. Note that the passages 361, 362 can have shapes and dimensions that are different from one another. Furthermore, these can be vias with a closed perimeter but also passages interfering with the wafer of the support although such passages have an unclosed lateral wall, for example with a section with a half-circle or U shape. Any arrangement passing through the support falls within the scope of the invention.

Figure 4:
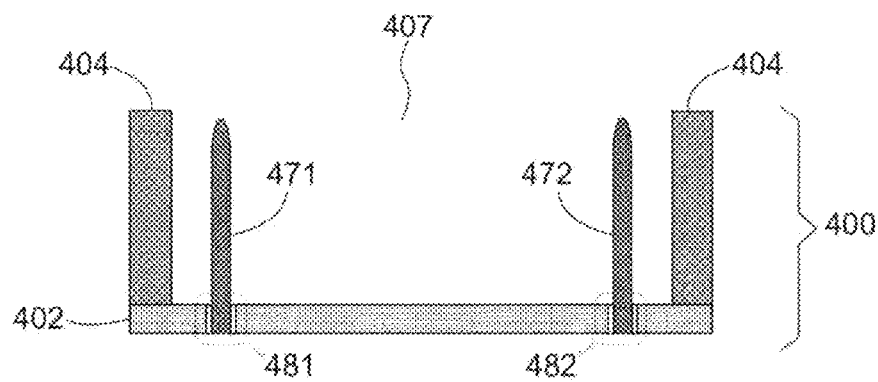
FIG. 4 is a cross-section view, according to the dotted line of FIG. 5, of a cavity, comprising at least two pillars, intended to receive the elements to be assembled in order to form, after closing using a cover, a sealed case according to the invention.

The individual battery devices 120 obtains at the end of the preceding steps are then stacked onto one another in an open receiving cavity 407 shown in FIG. 4. The latter is intended to form in fine the sealed case 400 containing the 3D assembly of micro-batteries carried by superimposed devices. At this stage the cavity is defined by a support forming the bottom 402 of the cavity and lateral walls 404, with these walls 404 being advantageously integral with the bottom 402. The cavity is characterised by the presence of at least one electrically conductive pillar and preferably of at least two pillars, 471 and 472, parallel to the walls and shown vertically in this figure. The internal dimensions of the open cavity are advantageously at least identical to the overall dimensions of an individual battery after cutting as shown in FIG. 3. The pillars, made for example from metal or a metal alloy, are implanted on the support forming the bottom of the cavity 402 by more preferably making it possible to obtain an electrical insulation between the cavity and the metal pillars, for example by electrically insulating the electrically conductive pillars relative to the bottom 402 by a filling at their interface which is of an insulating nature; this is in particular desired in the case of a conductive bottom 402. Alternatively or as a complement, the pillar/bottom assembly makes it possible to guarantee the seal required by the application with respect to the outside atmosphere. The carrying out of insulated and sealed crossings is for example based on conventional glass melting techniques such as glass-to-metal or glass-to-ceramic sealing for the interface with the pillar. The glass used more preferably has an adjusted composition in order to ensure its sealing and insulating functions at the level required by the application. In addition, the coefficient of thermal expansion (CTE) is adapted to the materials comprising the pillars and the cavity in order to not develop mechanical stress that could affect the seal of the case and cause leaks.

Figure 5:
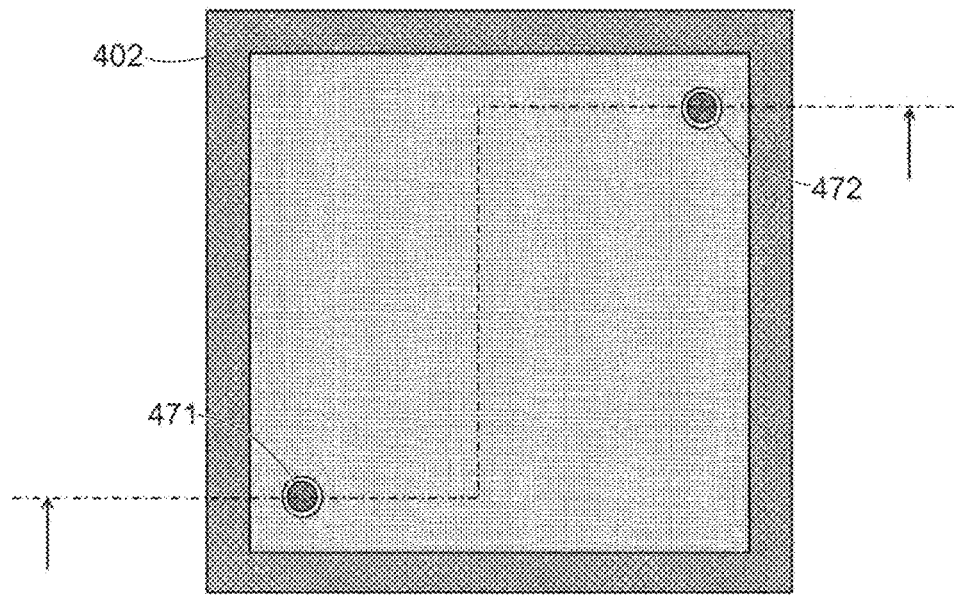
FIG. 5 is a plan view of the cavity hereinabove with its pillars for positioning and for interconnecting elements to be assembled.

FIG. 4 diagrammatically shows an open cavity according to the invention. An embodiment for the manufacture thereof shall be provided hereinafter. In a preferred embodiment, a strip with a thickness of about 1 mm (millimeter) of a Fe-Ni-Co alloy, in the following proportions: 54% Fe, 29% Ni and 17% Co, of the so-called "Kovar" type is used for the carrying out of the open cavity 407 provided with its two vertical pillars, 471 and 472, with hermetic interfaces (typically glass-metal) 481 and 482. One of the advantages linked to the use of a strip made from an alloy of the "Kovar" type mentioned hereinabove resides in its thermal properties. Indeed, the value of the coefficient of thermal expansion of this material is stable in a wide range of temperatures ranging from 25° C. to 300° C. It is also very close to that of a borosilicate glass used for hermetic crossings i.e. of about $5 \times 10^{-6}$ K$^{-1}$. The inner surface of the open cavity 407 is, for example, a square with a side of 1.02 cm, i.e. slightly larger than the dimensions of a device obtained after cutting, i.e. with a side of 1 cm, value mentioned hereinabove by way of example in the description of FIG. 2. The height of the vertical walls 404 is for example about 800 μm while the thickness of the support forming the bottom 402 of the cavity is about 200 μm. The pillars, for example made of metal or metal alloy, 471 and 472, have, as has already been seen, a section with a geometrical shape adapted to that of passages 361 and 362. In this example, they are of a cylindrical shape with an outer section of 250 μm over a total height of 1000 μm. The portion of the pillars made of an alloy of the "Kovar" type are housed in the devices carrying the micro-individual batteries is then of a height of 800 µm. These values and dimensions are given by way of example intended to show an implementation of the invention and are not limited to the latter. Other values and dimensions, possibly very different, according to the considered applications of the invention are possible. FIG. 5 is a plan view of an example of the positioning of the vertical pillars, 471 and 472, on the support forming the bottom 402 of the cavity. The latter are positioned in such a way as to correspond to the passages 361 and 362 that pass through the current connectors 121 and 122, and the substrate 110 of each individual battery 120 as shown in FIG. 3. According to the applications and the devices 120 that must be able to be assembled the position occupied by the pillars can be different from that shown in FIG. 5. Here, the component formed by the micro-battery 120 is of rectangular section (here square) according to the plane of the bottom 402 and the pillars 471, 472 are spaced apart according to a diagonal of this section.

In the following step we shall carry out an assembly of several devices in a case according to the invention by stacking them in the cavity 407 described hereinabove. One of the aspects of this invention relates in particular to the three-dimensional integration of lithium micro-batteries that makes it possible to obtain a greater density of energy per unit area. It is for example possible to obtain a lithium battery using the operations of interconnection in parallel or in series of several individual batteries. For a connection in series, it can in particular be produced by: inversion of the electrical contacts during the carrying out of the components; by a rotation of a second component stacked on the first in order to have the negative collector correspond with the positive collector. It is also possible to consider a combination of components associated in series and components associated in parallel, for example a total stack of four batteries formed from 2 components in parallel in series with 2 other components in parallel.

Advantageously, a case according to the invention can be used to stack microelectronic devices, sensitive to their environment, of different natures, in order to obtain functionalities that are more complex than those provided by a single and same individual component. For example, modules for retrieving and storing energy can be carried out by assembling lithium batteries and photovoltaic cells within the same case. These multiple components can be connected together and/or electrically connected to the outside of the case by means of separate conductive pillars.

According to one of the principles of this invention, the pillars 471, 472 make it possible to vertically thread the devices onto one another.

Figure 6:
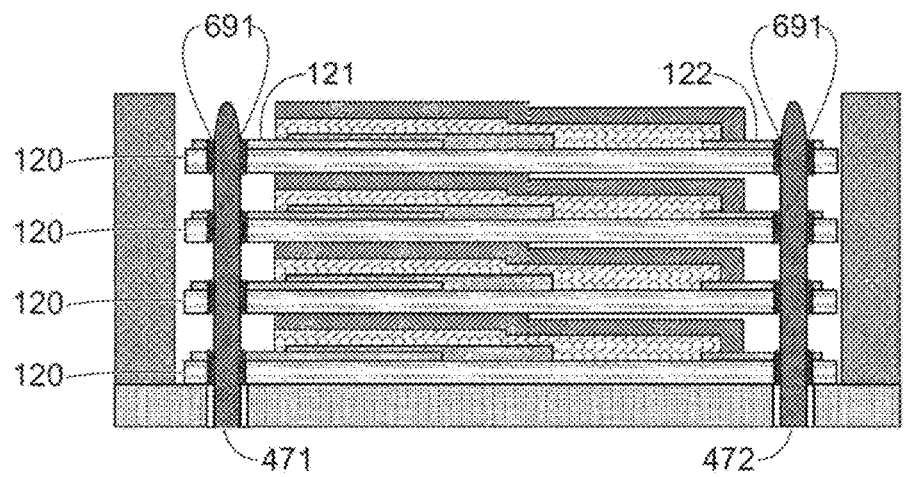
FIG. 6 shows an example of a parallel interconnection of four micro-batteries in a cavity.

FIG. 6 shows a parallel interconnection of individual batteries 120 numbering four in this example. They are threaded on the pillars, 471 and 472, through through-passages 361 and 362, arranged as has been seen hereinabove in each one of the micro-batteries. In this type of assembly all of the connectors 121 corresponding to each battery are electrically connected by the intermediary of the pillar 71 and all of the connectors 122 by the intermediary of the pillar 472. Identically, it can entirely be considered to carry out an assembly in series. Note that a case according to the invention confers a substantial advantage by making it possible for a self-aligning of the elements to be assembled to take place as such automatically on the pillars 471 and 472. In the case of FIG. 6, the supports of the devices come into contact with the upper electrode 125 of the electronic component of the device placed underneath and these supports are more preferably dielectric at this level.

The electrical connection created between the two pillars 471 and 472, and the current connectors 121 and 122, is, in an embodiment, reinforced or assured by the filling to the spaces left free due to a possible difference in section between the pillars and the passages of vias, 361 and 362. In this situation, the pillar comprises a pillar trunk (which is advantageously a mechanically self-supporting structure) and an interface (which is advantageously a filling portion of the spaces). Possibly, only certain pillars comprise this filling. In the example of FIG. 6 recourse may be had to a localised filling of these spaces by forming a conductive interface 691 with a conductive resin, filling carried out after each step of positioning of an individual battery of a level and before stacking of the battery of the following upper level. To do this, in particular resins with a conductive polymer base referred to as "E4110" are used marketed by the Epo-Tek company that make it possible, after a heat treatment at 150° C. for a duration of 15 minutes, to consolidate the electrical contact on each pillar. Other techniques are possibly used for the filling of interstitial spaces such as the rolling of a conductive film or the electrodeposition of conductive layers, or a deposition via spraying of metal targets.

Figure 7:
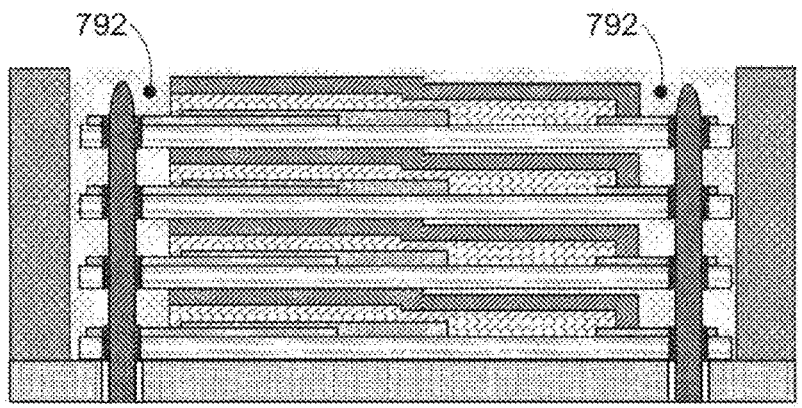
FIG. 7 shows the step of filling the cavity using an insulating resin.

FIG. 7 shows the following step of finalising the sealed case during which a filling is possibly carried out of the open cavity containing at this stage the four batteries in parallel in this example. The filling is done for example using non-conductive resins before closing with a cover that is sealed against oxidants such as shown in the following figure. Firstly, the mechanical fastening of the batteries is provided via a gluing operation carried out with insulating glues such as thermal epoxides or by using non-conductive adhesive films (not shown). After filling, as shown in FIG. 7, the batteries are therefore cleaned in an overmoulding resin 792 which is used for protecting and fastening as well as mechanically consolidating the whole. These are generally composite polymers with an epoxide base sometimes reinforced with mineral loads with a silica or alumina base that will be used. The insulating resin more preferably fully covers the batteries by creating a flat surface that facilitates the adding of a cover for the closing of the case as can be seen in the following figure. The pillars 471, 472 are, in this example, half the height of the cavity 407, in such a way as to not interfere with the cover 809.

Figure 8:
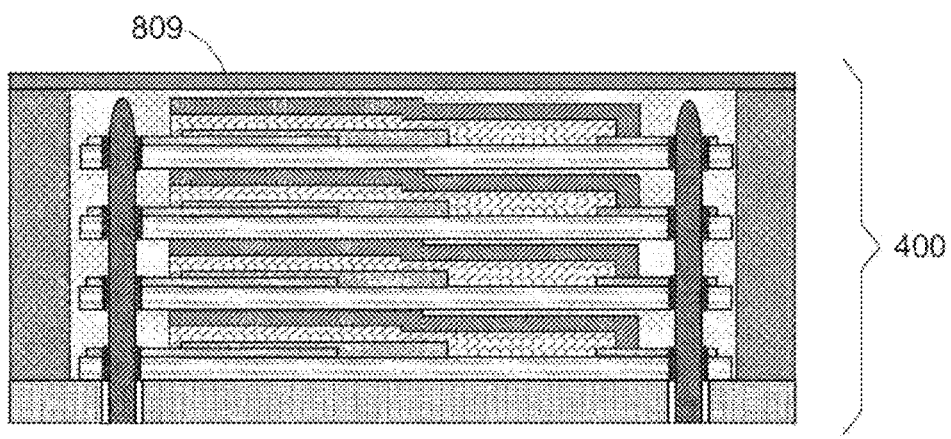
FIG. 8 shows the step of closing the cavity in order to form a sealed case according to the invention.

FIG. 8 is a diagrammatical representation of the case obtained after having proceeded with adding a sealed cover 809 by conventional techniques such as rolling via adhesive, direct gluing by using the resin for filling the cavity or sealing via abrasion or by welding. The cover is chosen preferably from the family of materials that are a barrier to water and/or air with values for VVVTR between $10^{-4}$ and $10^{-6}$ $g \cdot m^{-2} \cdot j^{-1}$ and OTR between $10^{-4}$ and $10^{-6}$ $cm^{-3} \cdot m^{-2} \cdot j^{-1}$. By way of example, the cover 809 is a simple metal film made of aluminium 50 µm thick glued directly by using the adhesive properties of the filling resin 692. The use of other single- or multi-layer films provided with adhesive is also possible for the carrying out of the cover. The cover 809 can also carry one or several electronic components as in the case of FIG. 10. In the case of incorporating components such as photovoltaic cells, it will be useful to arrange a cover 809 and/or a bottom 402 that are transparent and that the cell or cells be facing this cover and/or bottom 402. Preferentially, transparent walls and/or transparent filling resins must also be considered in this case.

The final case 400 obtained after having executed the various steps detailed hereinabove is dimensioned to receive individual identical batteries. As has been seen, they are in this example of a square surface with a side of about 1 cm and with a thickness of 9.5 µm arranged on a substrate 50 µm thick. In these conditions, the final dimensions of the case are those of a parallelepiped with a square base with a side of 1.1 cm and of a height of 0.1 cm. This is only an example, as the dimensions of the cavity of a case according to the invention can, as has been seen, be adapted to receive individual batteries and, more generally, any electronic device of any size.

According to another possibility, the pillars 471 and 472 of FIG. 6 can be positioned freely at the periphery of the component but also inside the active portion of the microbattery. The only condition is to have these pillars geometrically correspond with the passages, 361 and 362, opening onto the current collecting connectors of each unit battery. In this case, a zone inside the active portion of the microbattery has at least one portion of the electrical connectors; this situation corresponds to a configuration that would be different from that of the figures, since the distribution of the connectors and of the active portions of batteries are modified, in order to release a connection zone within the active layers.

Figure 9:
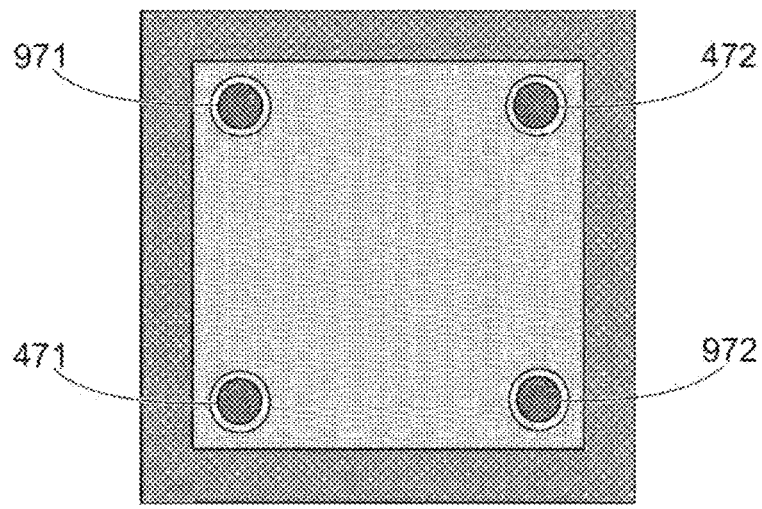
FIG. 9 shows the case of a cavity comprising more than two pillars.

In order to rigidify the final system and to improve the maintaining of the superimposed devices within the cavity 407, it is possible to increase the number of vertical pillars by creating others at the periphery of the active surface. Corresponding passages are formed in an additional manner through the device or devices. FIG. 9 has an embodiment with four pillars positioned on the corners of the individual batteries. In this example there are the two preceding pillars: 471 and 472, which, respectively, connect the connectors: 121 and 122, of each individual battery. From an electrical standpoint, the additional pillars 971 and 972, can be passive or active. The role of the passive pillars is purely mechanical while that of the active pillars is double, electrical and mechanical. Although the battery only has two electrical outputs one anodic and the other cathodic, it is possible indeed to have several vertical pillars with a routing that makes it possible to connect several pillars together. In the case of active pillars, they can have the same design as the two electrically conductive pillars 471, 472. If the additional pillar or pillars are passive, they can be formed from a dielectric material and/or pass through a passage in a dielectric zone or at the least non-active of the device and/or have an insulating dielectric material between the trunk of these pillars and the zone of the crossed dispositive.

Figure 10:
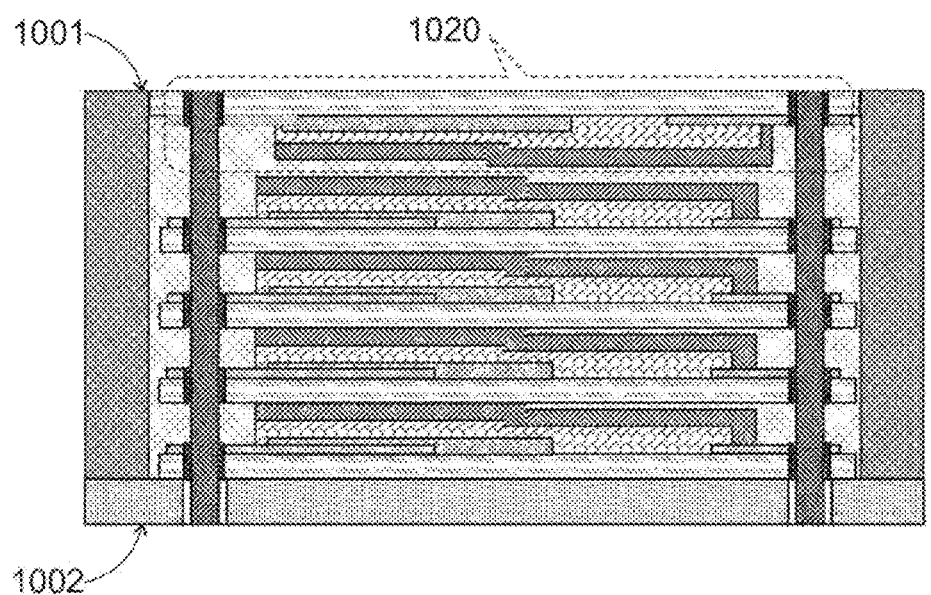
FIG. 10 shows the closing of a cavity using a micro-battery placed head-to-toe.

As shown in FIG. 10, the cover 809 can authorise a renewed contact for at least one of the electrically conductive pillars 471, 472 through its thickness. Passages are then made in the cover 809, as in the case of the bottom of the support 110, in such a way as to cooperate with the pillars 471, 472. This authorises a double access to the electrical contacts of the micro-battery or micro-batteries 120 either by the upper face 1001 or by the lower face 1002 of the case. In this situation, the electrically conductive pillars 471, 472 are preferably of a height sufficient to pass through at least one portion of the thickness of the passages of the cover 809.

Another alternative aspect or one that can be combined consists in having the cover 809 carry an electronic component. This can for example be a battery identical to the stacked components. In order to satisfy this arrangement, the cover provided with a last battery, forming a set 1020, used as a closing for the open cavity is advantageously mounted in head-to-toe configuration. Advantageously, this alternative makes it possible to increase the power-flux density with respect to the main configuration.

FIGS. 11a to 11f describe an embodiment of the cavity 407 and of the pillars 471, 472. The open cavity is obtained in this case preferentially using a substrate made of a material that is sealed from the oxidants of ambient air such as silicon, ceramic or glass. The first step shown in FIG. 11a consists in carrying out as many holes as there are pillars to be formed and in the example two holes 1101 and 1102, in the substrate chosen as a base for carrying out the case support. The shape, the outer diameter and the geometric positioning of the holes are adapted to those of the passages of vias, 361 and 362, that have been made in each microbattery 120 as shown in FIG. 3. Their outer section must be less than or equal to that of these passages of vias. They can be obtained by implementing photolithographic techniques. In a preferred embodiment, the holes 1101 and 1102, are defined by photolithography and etching of a substrate of silicon made integral temporarily with a support 1103, for example also made of silicon, used as a handle for handling. The etching of these holes, over the entire thickness of the substrate made of silicon, is carried out for example by using anisotropic plasmas etching using fluorinated or fluorinated carbon gases. As such, for example, in a silicon substrate with a thickness of 1000 µm, two holes, 1101 and 1102, are etched with a section of 250 µm passing through the entire thickness of this substrate to the handle for handling 1103.

For the forming of the pillars, the holes are then filled, using, in the case with electrically conductive pillars, a material that has excellent electronic conductivity, i.e. greater than $10^2$ S·m$^{-1}$. The filling can be carried out according to several methods with different types of conductive materials: for example by using conductive polymers or by practising a metallisation using an electrolytic deposition or via spraying. By way of a non-limiting example, the filling materials are chosen to be conductive such as tungsten, copper or polycrystalline silicon. According to a preferred embodiment, the filling of the holes is carried out using a metallisation of copper obtained via electrolysis. Before the step of electrolysis properly speaking, as shown in FIG. 11b, at least one insulating layer 1108 is deposited on the inner walls of the holes. The materials that can be used for this layer include: silicon oxide, silicon nitride and, more preferably, silicon oxinitride (SiON) deposited over a thickness of 2 µm using a technique of chemical vapour deposition. Optionally, the insulating layer can be reinforced by a barrier layer of TiN/Ti or of TaN/Ta which is used to prevent any diffusion of copper into the material constituting the substrate 1100.

The method of electrolysis begins with the deposition of a primary layer (not shown) of copper on the walls of each hole 1101 and 1102. The main function of such a layer is to allow for the priming of the electrolytic deposition of copper that will follow. This primary layer is deposited over a typical thickness of 10 µm. It can be carried out by electrolysis, but more preferably by known successive PVD (acronym for "physical vapour deposition") and CVD (acronym for "chemical vapour deposition") techniques. This primary layer has for function to initiate the electrolytic deposition of the copper or other material.

Figure 11A:
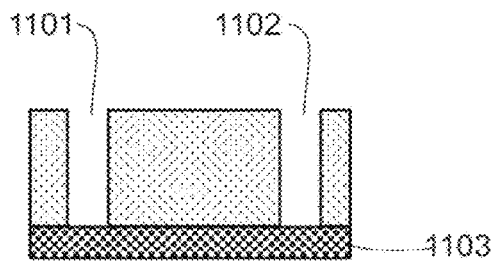
FIGS. 11a-11f show the steps of carrying out a cavity and pillars using a substrate made of silicon.
Figure 11D:
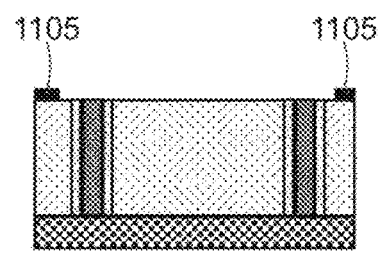
Figure 11B:
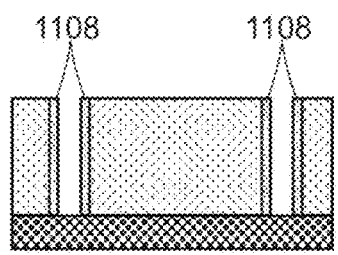
Figure 11E:
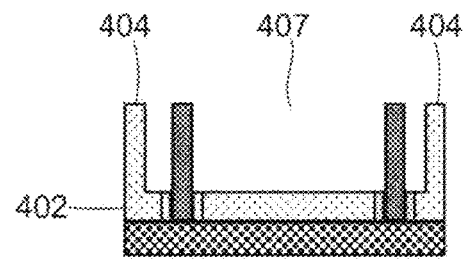
Figure 11C:
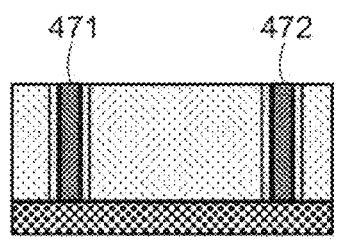

As shown in FIG. 11c, the electrolytic deposition of the pillars 471, 472 is then carried out by using for example a large range of electrolytes, alkaline as well as acidic. The utilisation of acid baths with a sulphate base is recommended for the implementing of the invention. The use of chlorides or fluoborates is also possible.

The following step is shown in FIG. 11d when the deposition is carried out of a layer of resin or of silicon oxide wherein is defined and carried out using standard photo-lithographic methods, a hard mask 1105.

As shown in FIG. 11*e*, the hard mask then makes it possible to define the zones corresponding to the walls 404, 1160 and bottom 402 of the open cavity 407 created after etching the substrate. The method for etching the silicon of the substrate is potentially identical to that described hereinabove. The depth of the silicon etched is for example about 800 µm in order to leave a bottom 402 of a thickness of 200 µm. At the end of the step of etching the silicon of the substrate, the insulating oxide 1108 is also finally etched, on the portions of the pillars released by the etching of the cavity 407, more preferably with the same method as that used for the etching of the hard mask 1105.

Figure 11F:
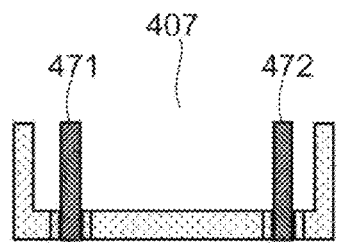

As shown in FIG. 11*f*, after separation with the handle for handling by conventional means, an open cavity 407, as beforehand, is obtained provided in this example with two vertical metal pillars 471, 472 electrically insulated from the wall 404, and from the bottom 402, by the insulating layer 1108. The characteristic dimensions of the cavity are, for example, identical to those obtained previously, i.e. a square with a side of 1.02 cm. The thickness of the bottom 402 is 200 µm and the height of the walls 404 is 800 µm, for example.

Note that in the case of use of glass or of an insulating material for the substrate, the insulating layer 1108 is no longer useful and can be omitted.

In the case of forming additional non-conductive pillars, the holes 1101 and 102 will be filled, at least on their perimeter, with an insulating material.

Such as described hereinabove, according to a non-limiting embodiment, an assembly is obtained comprising a sealed case intended to receive at least one component produced by the microelectronics industry that can optionally comprise optical and/or mechanical parts. This case is carried out preferably using a cavity of a material that is impermeable to the oxidising agent of its environment, of which the bottom is passed through by at least two conductive pillars insulated from the cavity; with the at least two pillars extending in the cavity over a height less than the depth of said cavity. In this preferred configuration, said at least one component comprises a number of passages of through-vias at least equal to the number of pillars, with said passages being of suitable size and positioned in such a way that they make it possible to thread said at least one component in the pillars. Then, the case is filled with an insulating resin and closed with a sealed cover. The at least two pillars each advantageously establish an electrical connection with said at least one component, optionally, after adding a conductive resin in the passages of through-vias prepared in said component and before threading said component in the conductive pillars during the assembly.

In addition to the fact that this invention proposes a solution for assembling a unique electronic component, it also makes it possible to carry out modules comprising several components that can be of an identical or different nature. It is possible for example to carry out a sealed case containing a multitude of lithium batteries connected in series or in parallel.

The invention claimed is:

1. An electronic system, comprising:
   at least one device comprising a substrate, which is semiconductor-based or glass-based, and which carries at least one electronic component provided with at least one electrical connector;
   at least one passage extending through at least the at least one electrical connector in a thickness direction of the at least one device;
   a support of said at least one device;
   at least one electrically conductive pillar protruding from a first face of the support, passing through the at least one passage, and being electrically connected with the at least one electrical connector; and
   a case defining a cavity configured to receive the at least one device, the support forming a bottom of the case, and the case comprising a lateral wall extending from the support in the thickness direction.

2. The electronic system according to claim 1, further comprising several devices of said at least one device in superposition in the thickness direction, the at least one electrically conductive pillar passing through the at least one passage of each of said at least one device.

3. The electronic system according to claim 1,
   wherein the at least one electrical connector comprises two electrical connectors, each of the two electrical connectors passing through the at least one passage, and
   wherein the at least one electrically conductive pillar comprises two electrically conductive pillars, one of the two electrically conductive pillars being electrically connected with one of the two electrical connectors, and the other of the two electrically conductive pillars being electrically connected with the other of the two electrical connectors.

4. The electronic system according to claim 3,
   wherein the at least one device is of rectangular section in a plane perpendicular to the thickness direction, and
   wherein the two electrically conductive pillars are spaced apart diagonally in the plane of the rectangular section.

5. The electronic system according to claim 1, wherein the at least one passage also extends through the substrate.

6. The electronic system according to claim 5, wherein the at least one electrical connector is disposed against the substrate at least around an opening through which the at least one passage extends.

7. The electronic system according to claim 1, wherein the at least one electrically conductive pillar protrudes from the first face of the support and passes through the at least one passage so as to be exposed on a second face of the support opposite the first face.

8. The electronic system according to claim 1, wherein the at least one electrically conductive pillar comprises a contact interface configured to ensure an electrical connection between a trunk portion of the at least one electrically conductive pillar and the at least one electrical connector.

9. The electronic system according to claim 8, wherein the contact interface is a resin or an electrically conductive metal layer that covers the trunk portion.

10. The electronic system according to claim 1, wherein the lateral wall and the support are single-block.

11. The electronic system according to claim 1, further comprising a cover closing the cavity and disposed against the lateral wall.

12. The electronic system according to claim 11, wherein the cover comprises, for each of the at least one electrically conductive pillar, at least one other passage extending through the cover in the thickness direction so as to expose the at least one electrically conductive pillar on a face of the cover that faces away from the case.

13. The electronic system according to claim 12, wherein the cover carries the at least one electronic component provided with the at least one electrical connector, which passes through the at least one other passage of the cover, at least one of the at least one electrically conductive pillar passing through the at least one other passage and being configured to be in electrical connection with the at least one electrical connector passing through by the at least one other passage.

14. The electronic system according to claim 13, wherein the at least one electronic component carried by the cover is disposed on another face of the cover that faces toward an inside of the cavity, and is configured to be connected to the at least one electrically conductive pillar.

15. The electronic system according to claim 1, wherein an electrically insulating filling material is disposed in the cavity and around the at least one device.

16. The electronic system according to claim 1, wherein the at least one electrically conductive pillar is electrically insulated from the support.

17. The electronic system according to claim 1, wherein the at least one electrical component is a battery.

18. The electronic system according to claim 1, further comprising at least one additional electrically conductive pillar protruding from the first face of the support, each of the additional at least one electrically conductive pillar passing through the at least one passage and being configured so as to not be in electrical connection with the at least on electrical connector.

19. A method for manufacturing an electrical system comprising at least one device comprising a substrate, which is semiconductor-based or glass-based, and which carries at least one electronic component provided with at least one electrical connector, and a support of said at least one device, the method comprising:
    forming, in the at least one device, at least one passage extending through at least the at least one electrical connector in a thickness direction of the at least one device;
    forming at least one electrically conductive pillar protruding from a first face of the support;
    mounting the at least one device on the support so that each of the at least one electrically conductive pillar passes through the at least one passage and is configured to be in electrical connection with the at least one electrical connector; and
    forming a case defining a cavity configured to receive the at least one device, the support forming a bottom of the case, and the case comprising a lateral wall extending from the support in the thickness direction.

20. The method according to claim 19, wherein the at least one electrically conductive pillar is formed so as to protrude from the first face of the support and to pass through the at least one passage so as to be exposed on a second face of the support opposite the first face.

21. The method according to claim 20, wherein the lateral wall and the bottom are obtained by forming the cavity in a starting substrate.

22. The method according to claim 21, wherein:
    the forming the at least one electrically conductive pillar comprises forming a hollow pattern of a pillar trunk in the starting substrate and filling the hollow pattern with an electrically conductive material, and
    the forming the case comprises, after the forming the at least one electrically conductive pillar, etching a portion of the starting substrate so as to leave in place the at least one electrically conductive pillar, the bottom of the case, and the lateral wall of the case.

23. The method according to claim 19,
    wherein the forming the at least one electrically conductive pillar comprises forming a pillar trunk portion protruding from the support, and
    wherein the forming the at least one passage and the forming the at least one electrically conductive pillar preserve a space between the pillar trunk portion and the at least one passage,
    the method further comprising forming a contact interface between the pillar trunk portion and the at least one passage by filling at least the space with a conductive resin.

* * * * *